May 30, 1967 J. F. LARKIN 3,322,268

PACKAGE FOR ELECTRICAL COMPONENTS

Filed Nov. 9, 1965 2 Sheets-Sheet 1

INVENTOR
JOSEPH F. LARKIN

BY Donald S. Cohen

ATTORNEY

May 30, 1967 J. F. LARKIN 3,322,268

PACKAGE FOR ELECTRICAL COMPONENTS

Filed Nov. 9, 1965 2 Sheets-Sheet 2

INVENTOR
JOSEPH F. LARKIN
BY Donald S. Cohen
ATTORNEY

United States Patent Office 3,322,268

Patented May 30, 1967

3,322,268

PACKAGE FOR ELECTRICAL COMPONENTS

Joseph F. Larkin, Holland, Pa., assignor to International Resistance Company, Philadelphia, Pa.

Filed Nov. 9, 1965, Ser. No. 506,930

4 Claims. (Cl. 206—65)

The present invention relates to a package for electrical components, and more particularly to a package for electrical components of the type having a central cylindrical body portion and a separate terminal wire projecting longitudinally from each end of the body portion.

Electrical components, such as resistors, capacitors and the like, are packaged in small quantities for sales to the smaller user of such components, such as the electrical, television and radio repairmen, electronic experimental and development laboratories and the small electronic equipment manufacturer. Such packages must be small and compact so that the user can easily store and carry around the many various types and values of the components which he needs yet protect the components from being damaged during handling. Also, the package should permit ease of identification of the components contained therein and permit ease of removal of the components from the package. Finally, the package should be of a construction to permit the components to be easily and quickly assembled in the package so that the cost of the package does not add any appreciable cost to the components.

It is an object of the present invention to provide a novel package for electrical components.

It is an other object of the present invention to provide a package for electrical components which protects the components from being damaged during handling yet permits ease of removing the components from the package.

It is still another object of the present invention to provide a package for electrical components which exposes a portion of the components for ease of identification.

It is a further object of the present invention to provide a package for electrical components of a construction which permits the components to be easily and quickly assembled in the package with a minimum of expense.

Other objects will appear hereinafter.

For the purpose of illustrating the invention, there is shown in the drawings a form which is presently preferred; it being understood, however, that this invention is not limited to the precise arrangements and instrumentalities shown.

Figures 1, 2, 3, 4, 5:
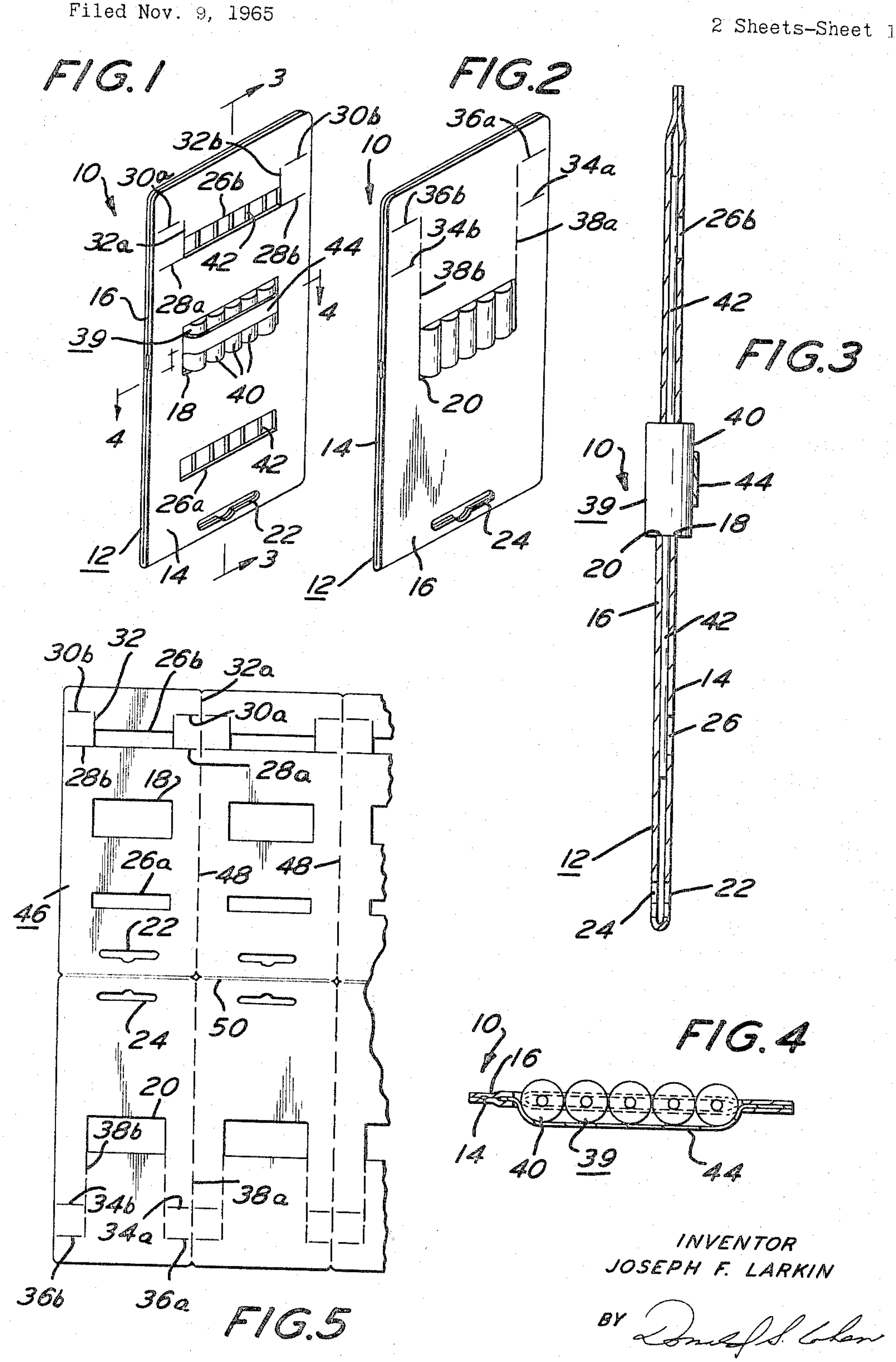
FIGURE 1 is a perspective view of the package of the present invention as viewed from the back side of the package.
FIGURE 2 is a perspective view of the package of the present invention as viewed from the front side of the package.
FIGURE 3 is a sectional view taken along lines 3—3 of FIGURE 1.
FIGURE 4 is a sectional view taken along line 4—4 of FIGURE 1.
FIGURE 5 is a plan view of a portion of the blank from which the package of the present invention is made.

Referring initially to FIGURES 1 and 2, the package of the present invention is generally designate as 10. Package 10 comprises a substantially rectangular strip 12 of heavy paper which is folded in half to form two flaps 14 and 16 of the same size and shape which are in overlapping, contacting relation. For ease of description, the flap 16 will be referred to as the "front flap," and the flap 14 will be referred to as the "back flap." The fold line and the edges of the flaps parallel to the fold line will be referred to as the ends of the package 10, and the other two parallel edges as the sides of the package 10.

Each of the flaps 14 and 16 has a rectangular opening 18 and 20 respectively therethrough substantially intermediate the ends of the flaps and parallel to the ends. The openings 18 and 20 overlap each other when the flaps 14 and 16 are in overlapping position. The flaps 14 and 16 have registering mounting slits 22 and 24 therethrough adjacent the folded end of the package. Back flap 14 has a pair of additional rectangular openings *26a* and *26b* therethrough spaced from and on opposite ends of the opening 18. The openings *26a* and *26b* are parallel to and of the same width as the opening 18.

Back flap 14 has a pair of cut lines *28a* and *28b* extending from the opening *26b* to points spaced from the side edges of the flap. The cut lines *28a* and *28b* extend in alignment with the edge of the opening *26b* which is closest to the opening 18. The back flap 14 has a second pair of cut lines *30a* and *30b* extending parallel to the cut lines *28a* and *28b* substantially intermediate the cut lines *28a* and *28b* and the closest end edge of the flaps 14. The cut lines *30a* and *30b* are substantially the same length as the cut lines *28a* and *28b* and extend to points spaced from the side edges of the flap 14. Cut lines *32a* and *32b* are provided in the flap 14 and extend from adjacent the inner ends of the cut lines *30a* and *30b* respectively to the closest corners of the opening *26b*.

As shown in FIGURE 2, front flap 16 has a pair of cut lines *34a* and *34b* which extend along and are of the same length as the cut lines *28a* and *28b* on the flap 14. The flap 16 also has a second pair of cut lines *36a* and *36b* which extend along and are of the same length as the cut lines *30a* and *30b* in the flap 14. A pair of cut lines *38a* and *38b* are provided in the flap 16 and extend from adjacent the inner ends of the cut lines *36a* and *36b* respectively to the closest corners of the opening 20 in the cut lines *38a* and *38b* across the inner end of the cut lines *34a* and *34b* respectively.

The electrical components, generally designated 39, are arranged in parallel, side-by-side relation and are sandwiched between the flaps 14 and 16. The body portions 40 of the electrical components 39 are positioned within and project through the openings 18 and 20 in the flaps 14 and 16. The terminal wires 42 of the electrical components 39 extend from the ends of the body portions 40 toward the end edges of the package 10 and cross the openings *26a* and *26b* in the flap 14. The openings 18 and 20 in the flaps 14 and 16 are of a length equal to the length of the body portions 40 of the electrical components 39, and of a width equal to the combined diameters of the body portions 40. Thus, the body portions 40 fit within the openings 18 and 20. As shown in FIGURES 1 and 4, a narrow strip 44 of pressure sensitive adhesive tape extends across and is adhered to the body portions 40. The strip of tape 44 extends across the inner surface of the flaps 14 and 16 between the side edges of the openings 18 and 20 and the side edges of the flaps, and is adhered to the inner surface of front flap 16. The flaps 14 and 16 are secured together by a suitable adhesive so that the electrical components 39 are retained therebetween.

The package 10 is formed from a blank 46, see FIGURE 5, which comprises a rectangular sheet of the rigid paper of a size having one dimension equal to the length of strip 12 which forms the flaps 14 and 16, and the other dimension equal to the combined widths of a plurality of the strips 12. A plurality of the various openings 18, 20, 26a and 26b, slits 22 and 24, and all of the cut lines are formed in the blank 46, such as by die cutting to form a plurality of the packages 10 arranged in side-by-side relation and separated by cut lines 48. Thus, a plurality of the back flaps 14 are formed in side-by-side relation along one-half of the blank 46, and an equal number of the front flaps 16 are formed in side-by-side relation along the other one-half of the blank. The back flaps 14 are separated from the front flaps 16 by a fold line 50. One surface of the blank 46 is coated with a thermosetting adhesive either over one or both of the groups of flaps.

Figure 6:
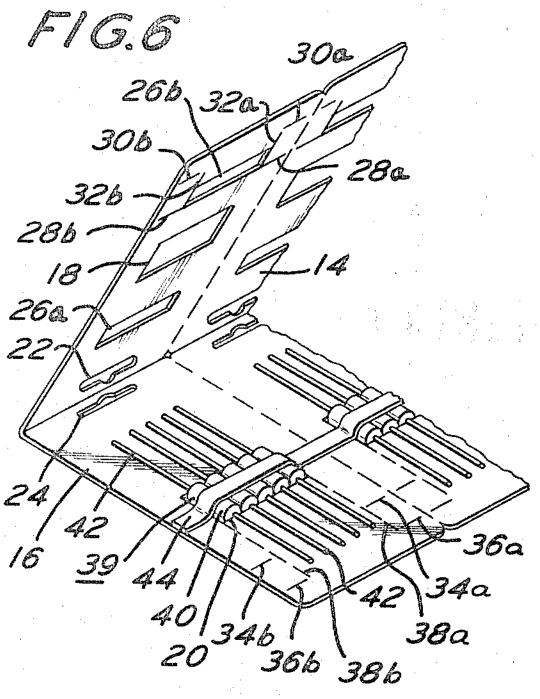
FIGURE 6 is a perspective view showing the manner of assembling the electrical components in the package of the present invention.

To form the package 10, the electrical components 39 are first mounted on an elongated strip of the pressure sensitive adhesive tape 44 with the components being arranged in groups spaced along the tape (see FIGURE 6). The number of the components 39 in each group equals the number to be contained in each package 10, and the groups are spaced apart a distance equal to the spacing between the openings 20 in the blank 46. A strip of the tape containing a number of groups of the components equal to the number of packages 10 in the blank 46 is placed across the flaps 16 with the components fitting into the openings 20 and the adhesive surface of the tape facing and contacting the flaps 16. By mounting the components 39 on the tape 44, all of the components for a plurality of the packages 10 are handled as a single unit and are easily and quickly placed in the packages in one operation. In addition, the tape 44 is adherently secured to the flaps 16 and thereby secures the components to the front flaps. Thus, the components 39 are secured to the front flaps 16 to permit ease of completing the assembling of the packages 10. The blank 46 is then folded along fold line 50 to place the back flaps 14 over the front flaps 16 and sandwich the components 39 therebetween. While holding the front flaps 16 in contact with the back flaps 14, the assembly is heated to set the thermosetting adhesive and bond the flaps together. The assembly is preferably heated only along the edges of the packages 10 so that the flaps 14 and 16 are not sealed to the terminal wires 42 of the components 39.

The assembly of the packages 10 can then be cut or torn along the cut line 48 to separate the individual packages. However, if desirable, the assembly of the packages 10 can be shipped in flat form or folded along the cut lines 48 in accordion fashion to be cut or torn apart by the retailer or user. The openings 26a and 26b in the back flap 14 permit the electrical components to be tested after packaging without removing the components from the package. The package 10 can be stored or displayed on hooks by means of the mounting slits 22 and 24.

Figure 7:
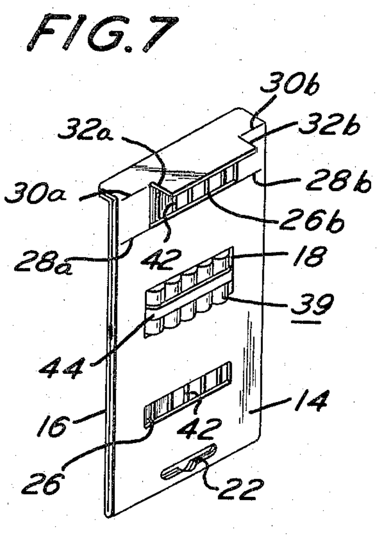
FIGURES 7–10 are perspective views of the package of the present invention illustrating the manner of opening the package to permit removal of the components.
Figures 8, 9, 10, 11:
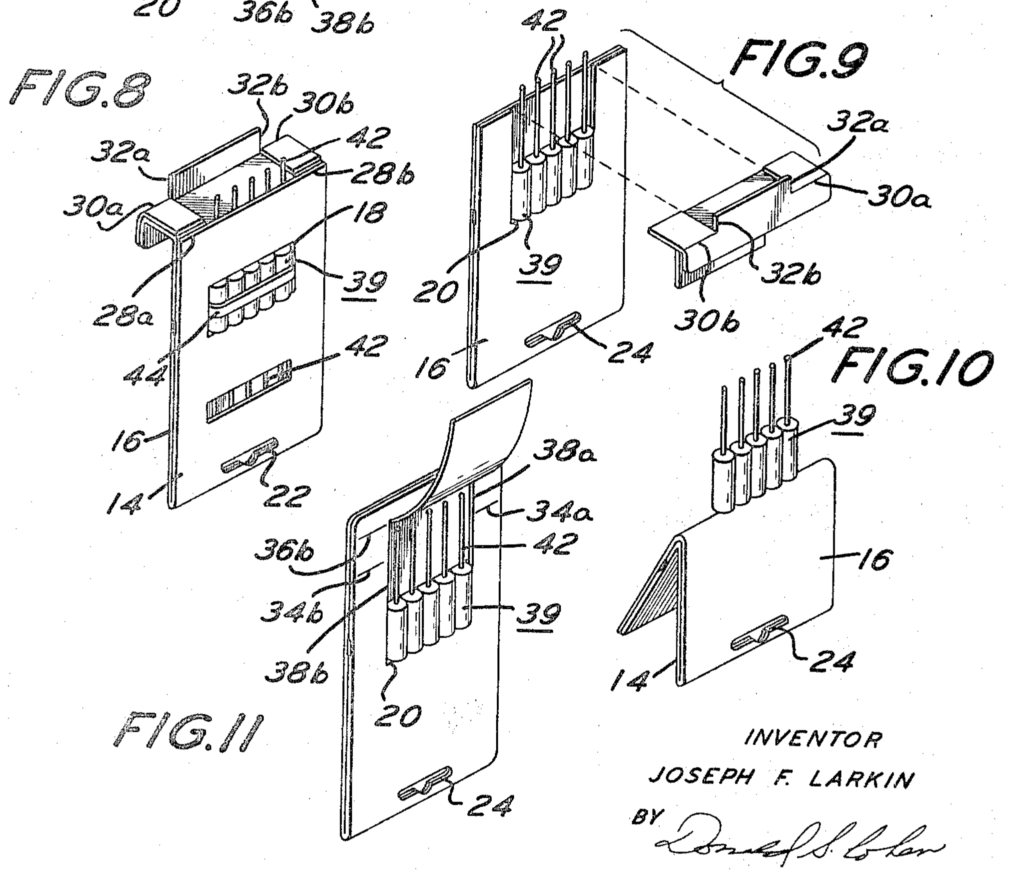
FIGURE 11 is a perspective view of the package of the present invention illustrating an alternative manner of opening the package.

Referring to FIGURES 7–9, there is shown the preferred method of opening the package 10 of the present invention to permit removal of the electrical components 39. To open the package 10, the package is held in one hand at the end having the mounting slits 22 and 24. The other end of the package 10 is bent along the cut lines 30a, 30b, 36a and 36b away from the back flap 14 as shown in FIGURE 7. This causes the back flap 14 to tear along the cut lines 32a and 32b from the opening 26b to the cut lines 30a and 30b. The bent end of the package 10 is then pulled downwardly to bend the package along the cut lines 28a, 28b, 34a and 34b as shown in FIGURE 8. This causes the small connection at the ends of the cut lines 28a, 28b, 34a and 34b to be broken. The bent end of the package 10 is then pulled further downwardly to tear the front flap 16 along the cut lines 38a and 38b until the opening 20 is reached. As shown in FIGURE 9, this completely removes the end of the package 10 and exposes the electrical components 39 so that the components can be removed by lifting them from the package.

Since the electrical components are adhered to the tape 44, they will not fall from the package 10 under their own weight even after the package is opened, but must be manually removed from the package. Therefore, even after one or more of the components are removed from the package 10, the package will still retain the remaining components to prevent their loss. To permit all of the components to be easily removed from the package at one time, the package 10 can be folded along the line of the remaining end of the opening 20 as shown in FIGURE 10. Since the ends of the tape 44 are clamped between the flaps 14 and 16, so folding the package will pull the tape away from all of the components 39 and permit ease of removal of the components. In addition, the package 10 can then be seated on a table or work bench and will act as a stand for the components.

Referring to FIGURE 11, there is shown another method of opening the package 10 to permit removal of the electrical components 39. For this method, the end edge of the opening 20 in the back flap 16 is lifted up and away from the flap. This tears the front flap 16 along the cut lines 38a and 38b until the cut lines 36a and 36b are reached. The electrical components 39 are then sufficiently exposed to permit their removal. If desired, the package 10 can then be folded along the other end edge of the opening 20 to remove the tape 44 and form the stand as shown in FIGURE 10.

Thus, there is provided by the present invention a package for electrical components which can be easily and relatively inexpensively manufactured in large quantities. The package can be easily and quickly opened to permit removal of one or more of the electrical components yet will retain the remaining components even after being opened. In addition, the package permits identification of the components therein, and testing of the components without removing the components from the package.

The present invention may be embodied in other specific forms without departing from the spirit or essential attributes thereof and, accordingly, reference should be made to the appended claims, rather than to the foregoing specification as indicating the scope of the invention.

I claim:

1. A package of electrical components of the type having a central body portion and terminal wires extending longitudinally from the ends of the body portion comprising:

A pair of rectangular flaps of the same size and shape arranged in overlapping relation and having a pair of end edges and a pair of side edges;

said flaps having overlapping rectangular openings therethrough between the end edges of the flaps with a pair of the edges of the openings being parallel to the end edges of the flaps;

one of said flaps having a pair of tear lines therein extending from the side edges of the opening in said one flap toward one end edge of said flaps and substantially parallel to the side edges of said flaps, and a second pair of tear lines extending from said first mentioned tear lines to the side edges of said flaps;

the other of said flaps having two additional rectangular openings therein of the same width as said first openings and at opposite sides of said first openings, a first pair of tear lines therein extending from the side edges of one of said additional openings toward said one edge of said flaps parallel to and overlapping a portion of the first pair of tear lines in said one flap, and a second pair of tear lines therein parallel to and overlapping the second pair of tear lines in said one flap;

a plurality of said electrical components sandwiched between said flaps with the body portion fitting in and extending through the openings in the flaps and the terminal wires extending toward the end edges of the flaps and extending across the additional openings in said other flap; and means securing the flaps together in contacting relation with the electrical components held therebetween, said tear lines permitting the package to be opened by bending the one end of the flap along said second pairs of tear lines to tear the other flap along its first pair of tear lines and then tearing the one flap along its first pair of tear lines to remove the portions of the flaps between the first pair of tear lines.

2. A package of electrical components in accordance with claim 1 in which the other of said flaps has a third pair of tear lines therein extending between the side edges of the one said additional opening at the side edges of the flap parallel to the second pair of tear lines, and the one said flap has a third pair of tear lines therein extending between the first pair of tear lines and the side edges of the flap overlapping and parallel to the third pair of tear lines in said other flap.

3. A package of electrical components in accordance with claim 1 including a strip of tape having a pressure sensitive adhesive on one surface thereof extending across and adhered to the body portions of the electrical components, the end of said strip of tape extending between the flaps with the adhesive surface of the tape facing and adhered to the inner surface of said one flap.

4. A package of electrical components in accordance with claim 1 in which the flaps are integral at one end edge thereof.

References Cited

UNITED STATES PATENTS

| | | | |
|---|---|---|---|
| 2,757,793 | 8/1956 | Deitz | 206—78 |
| 3,032,926 | 5/1962 | Lang | 206—78 |
| 3,198,329 | 8/1965 | Golenpaul et al. | 206—65 |
| 3,246,747 | 4/1966 | Blish | 206—78 |

FOREIGN PATENTS

| | | |
|---|---|---|
| 931,826 | 7/1963 | Great Britain. |

LOUIS G. MANCENE, *Primary Examiner.*